United States Patent [19]
Park

[11] Patent Number: 5,822,270
[45] Date of Patent: Oct. 13, 1998

[54] CIRCUIT FOR GENERATING INTERNAL COLUMN ADDRESS SUITABLE FOR BURST MODE

[75] Inventor: Churoo Park, Suwon, Rep. of Korea

[73] Assignee: Samsung Electronics Co., Ltd., Suwon, Rep. of Korea

[21] Appl. No.: 769,434

[22] Filed: Dec. 19, 1996

[30] Foreign Application Priority Data

Dec. 22, 1995 [KR] Rep. of Korea .................. 1995/54746

[51] Int. Cl.⁶ ............................................ G11C 8/00
[52] U.S. Cl. ...................... 365/233; 365/230.08; 365/236
[58] Field of Search .................................. 365/233, 236, 365/230.08, 230.06

[56] References Cited

U.S. PATENT DOCUMENTS

| | | | |
|---|---|---|---|
| 5,513,139 | 4/1996 | Butler | 365/233 X |
| 5,539,696 | 7/1996 | Patel | 365/233 X |
| 5,566,124 | 10/1996 | Fudeyasu et al. | 365/230.06 |
| 5,610,874 | 3/1997 | Park et al. | 365/233 |

*Primary Examiner*—David C. Nelms
*Assistant Examiner*—Huan Hoang
*Attorney, Agent, or Firm*—Marger. Johnson, McCollom & Stolowitz, P.C.

[57] ABSTRACT

An internal column address generation circuit generates an internal column address by utilizing an asynchronous counter. The circuit includes a column address buffer for synchronizing an initially received external address with an external system clock to generate the internal column address, and for synchronizing a counting bit output signal received at an internal input node with the external system clock to generate the internal column address; and an asynchronous counter connected to an output node of the column address buffer, for generating the bit output signal having the same or opposite phase as/to a phase of the internal column address received from the column address buffer, in response to a carry generation state.

4 Claims, 11 Drawing Sheets

CIRCUIT FOR GENERATING INTERNAL COLUMN ADDRESS SUITABLE FOR BURST MODE

BACKGROUND OF THE INVENTION

1. Field of the Invention

The present invention relates to a circuit for generating a column address in a semiconductor memory device, and more particularly to a circuit for generating an internal column address in which a plurality of internal column addresses are automatically generated in response to a single external address input in a synchronous dynamic random access memory (hereinafter, referred to as "SDRAM").

2. Description of the Related Art

In recent, the semiconductor memory device is developed towards the high density and high performance. That is, in accordance with the high performance tendency of the peripheral equipments, the semiconductor memory device should have a high data access speed and wide operational bandwidth. The performance of the memory device may be improved by employing a new technology such as a burst mode technology, which is widely used in the SDRAM employing synchronous protocol.

In a general DRAM (except for a nibble mode DRAM and expanded nibble mode DRAM), only one-bit data can be inputted/outputted per one input/output terminal in response to a single column address. Compared with such DRAM, the SDRAM generates n-bit data (where n=1, 2, 4, 8, and a full page) in response to a single column address input in synchronism with an external system clock. Therefore, when n≠1, n−1 column addresses are generated automatically from the interior of the chip and provided to a column decoder. It should be noted that the application is directed to a novel method for generating an internal column address effectively, which is generated at the interior of the chip, in contrast with an external column address generated from the exterior of the chip. The SDRAM with a circuit for generating such internal column address is disclosed in detail in Korean Patent Application No. 7127/93 (hereinafter, called "prior application") by an inventer, Cheol-Woo PARK et al., filed on Apr. 27, 1993 by the applicant.

Referring to FIG. 1, the prior art circuit for generating an internal column address includes a synchronous counter 12 for generating a bit output signal PCAi which increases in synchronism with a clock in response to an initial column address signal CAiINT, and a column address buffer 14 for generating the internal column address signal CAi in response to the bit output signal PCAi from the synchronous counter 12.

Referring to FIG. 2, there is shown an operational timing diagram of the synchronous counter 12 and the column address buffer 14.

Referring to FIG. 3, the column address buffer 14 includes a level converter 16 for converting the TTL (Transistor-Transistor Logic) level of an initial external address Ai into the CMOS (Complementary Metal-Oxide semiconductor Transistor) level, a delay 18 for delaying the output signal from the level converter 16, and a plurality of logic gates and transmission gates. The construction and operation of the column address buffer are disclosed in detail at pages 66 through 68 of the prior application.

FIG. 4 shows a schematic block diagram of the synchronous counter 12, and FIGS. 5 and 6 show different embodiments of unit counters ST1–ST8 shown in FIG. 4 respectively. Further, FIGS. 5 and 6 show an interleave mode counting circuit and a sequential mode counting circuit, respectively. Here, the synchronous counter 12 is an 8-bit counter comprised of eight stages ST1–ST8. The circuit configuration and operation of the synchronous counter 12 and the different embodiments of the unit counters, i.e., the stages ST–ST8, are disclosed in detail at pages 68 through 73 of the prior application. The interleave mode counter and the sequential mode counter are also mentioned in detail in Korean Patent Application Nos. 18130/92 (entitled "counter having an interleave mode") and 11485/94 (entitled "synchronous counter and carry propagation method therefor"). Therefore, reference should be made to the above mentioned applications for a better understanding of such counters.

Referring to FIG. 7, there is shown an operational timing diagram for explaining the problems which may be caused when generating the internal column address using the internal column address generation circuit of FIG. 1 having the synchronous counter 12 comprised of the unit counters ST1–ST8 shown in FIG. 5 and 6.

Since the prior art internal column address generation circuit of FIG. 1 includes the column address buffer 14 of FIG. 3, and the synchronous counter 12 of FIGS. 4, 5 and 6, the synchronous counter 12 forms a counting loop independent of the column address buffer 14 and generates the bit output signal PCAi. Here, the synchronous counter 12 receives, as shown in FIG. 2, the input signal CAiINT from the column address buffer 14 at the first cycle of the external column address for setting an initial value and then, generates the bit output signal PCAi, independent of the initial column address signal CAiINT, to the column address buffer 14 of which driver circuit delivers the internal column address signal PCAi to other circuits.

However, the prior art circuit of FIG. 1 may cause a problem that the synchronous counter 12 generates a carry abnormally. Namely, an invalid bit output signal PCAi which was previously latched (before a valid carry is generated in accordance with a new bit output signal PCAi with an initial value latched at a latch node YY) at the latch node YY of the unit counter may cause generation of an invalid carry as shown at a duration "a" of FIG. 7. If the invalid carry is at the logic high state and is not replaced with a valid value within a predetermined time, the data output of the counter is inverted by the invalid carry and this situation can not be recovered as shown in duration "b" of FIG. 7. Further, since the counter has an independent loop and the column address buffer 14 serves simply as a driver, the counter may become complicated in configuration.

Referring again to FIG. 7, the problems of the prior art internal column address generation circuit of FIG. 1 will now be mentioned in detail hereinbelow.

When generating the internal column address signal, the prior art circuit comprised of the column address buffer 14 of FIG. 3 and the unit counters of FIG. 5 or 6 may encounter the problems as follows.

The prior art column address generation circuit calculates, as shown in FIG. 7, a carry at a duration ("A" of FIG. 7) for which a clock φCLK is at the logic high state, and controls a counting operation of an upper address according to the calculated carry at a duration ("B" of FIG. 7) for which the clock φCLK is at the logic low state. In case where the external column address Ai is latched at the latch node YY of the counter and initialized (see duration "C" of FIG. 7), the duration "C" is much shorter than the duration "A" so that the invalid carry may be generated at a duration from a leading edge of the clock φCLK to a leading edge of a signal BISET. For instance, if the external address received immediately before the current external address is given to "510" has a value of "510", the value at the node YY of the counter become "511" so that the invalid carry of the logic high state may be generated at the duration "a" of FIG. 7. Here, since the value given at the node YY at the duration "C" is "510", the logic low state of the initial LSB (Least Significant Bit) column address information CAOINF must reset the logic high state of the invalid carry to the logic low state (problem of low carry propagation). If such reset operation is not completed at the duration for which the clock φCLK is at the logic high state, the MSB (Most Significant Bit) column address information CAi is counted erroneously due to the logic low state of the clock φCLK and the logic high state of the invalid carry. Namely, the value at the node YY must not be changed. However, as shown in the duration "b" of FIG. 7, the value at the node YY is changed to "0" value, causing a problem of an erroneous transition of the address. In such case, it is not possible to recover the erroneously generated address, thereby resulting in a system error.

SUMMARY OF THE INVENTION

It is therefore an object of the present invention to provide a circuit for generating an internal column address by utilizing an asynchronous counter.

It is another object of the present invention to provide a circuit for generating an internal column address having a single counting loop, which includes a column address buffer receiving an external address for generating the internal column address in response to a bit output signal PCAiB and a counter for increasably counting in response to the external address input.

According to an object of the present invention, a circuit for generating an internal column address in a synchronous semiconductor memory device, includes a column address buffer for synchronizing an initially received external address with an external system clock to generate the internal column address, and for synchronizing a counting bit output signal received at an internal input node with the external system clock to generate the internal column address; and an asynchronous counter connected to an output node of the column address buffer, for generating the bit output signal having the same or opposite phase as/to a phase of the internal column address received from the column address buffer, in response to a carry generation state.

BRIEF DESCRIPTION OF THE DRAWINGS

The above and other objects, features and advantages of the present invention will become more apparent in the light of the following detailed description of an exemplary embodiment thereof taken with the attached drawings in which.

DETAILED DESCRIPTION OF THE PREFERRED EMBODIMENT

Figure 8:
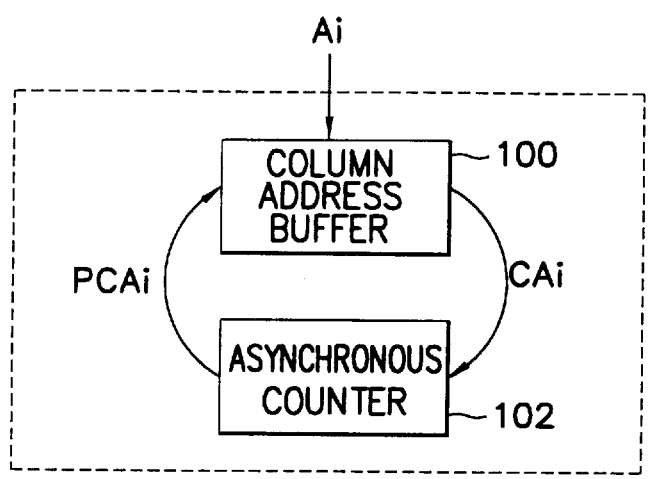
FIG. 8 is a block diagram of a circuit for generating an internal column address according to an embodiment of the present invention.

Referring to FIG. 8, a circuit for generating an internal column address according to the present invention includes a column address buffer 100 for initially generating an address Ai supplied from the exterior and generating, in synchronism with a system clock, an internal column address CAi in response to a bit output signal PCAi, and an asynchronous counter 102 having an output terminal connected to an input terminal of the column address buffer 100.

Figure 9:
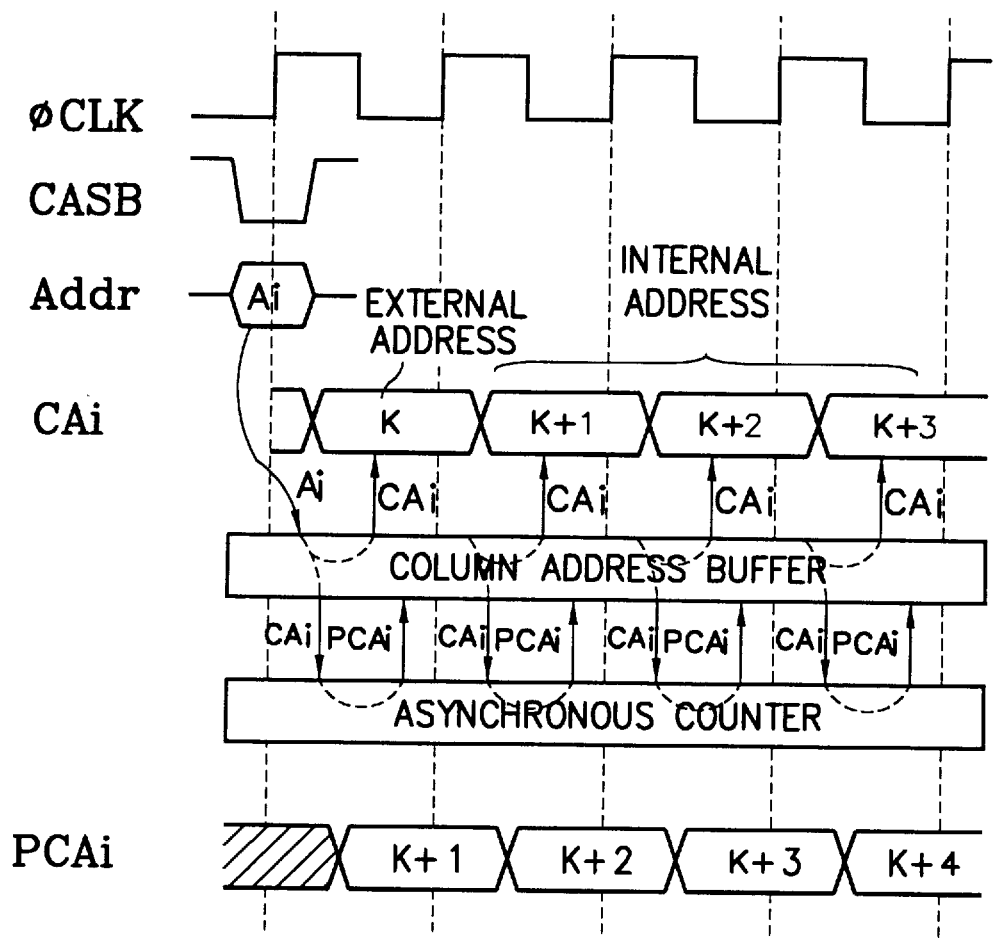
FIG. 9 is an operational timing diagram for explaining operation of the circuit shown in FIG. 8.
Figure 10:
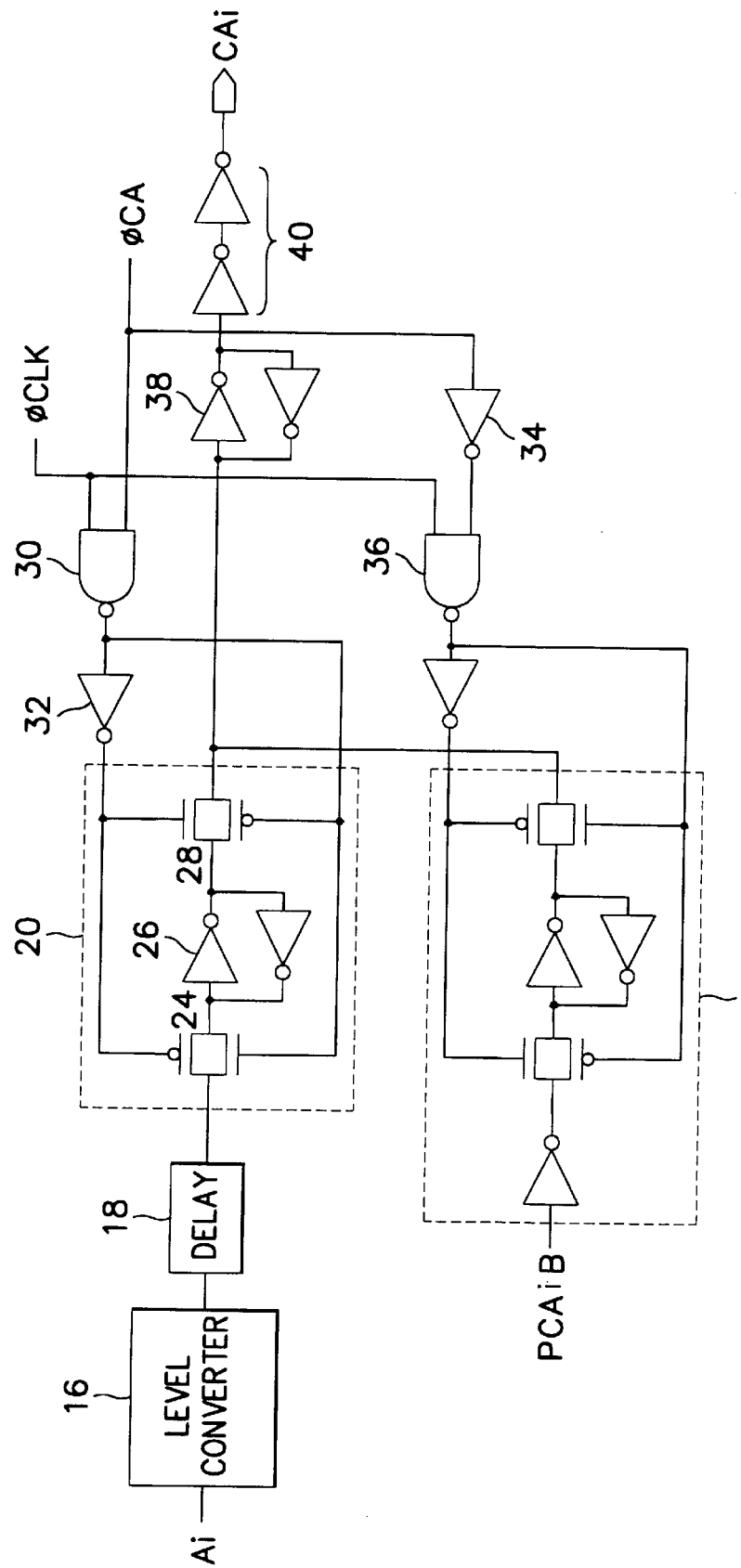
FIG. 10 is a detailed circuit diagram of a column address buffer of FIG. 8 according to an embodiment of the present invention.
Figure 11A:
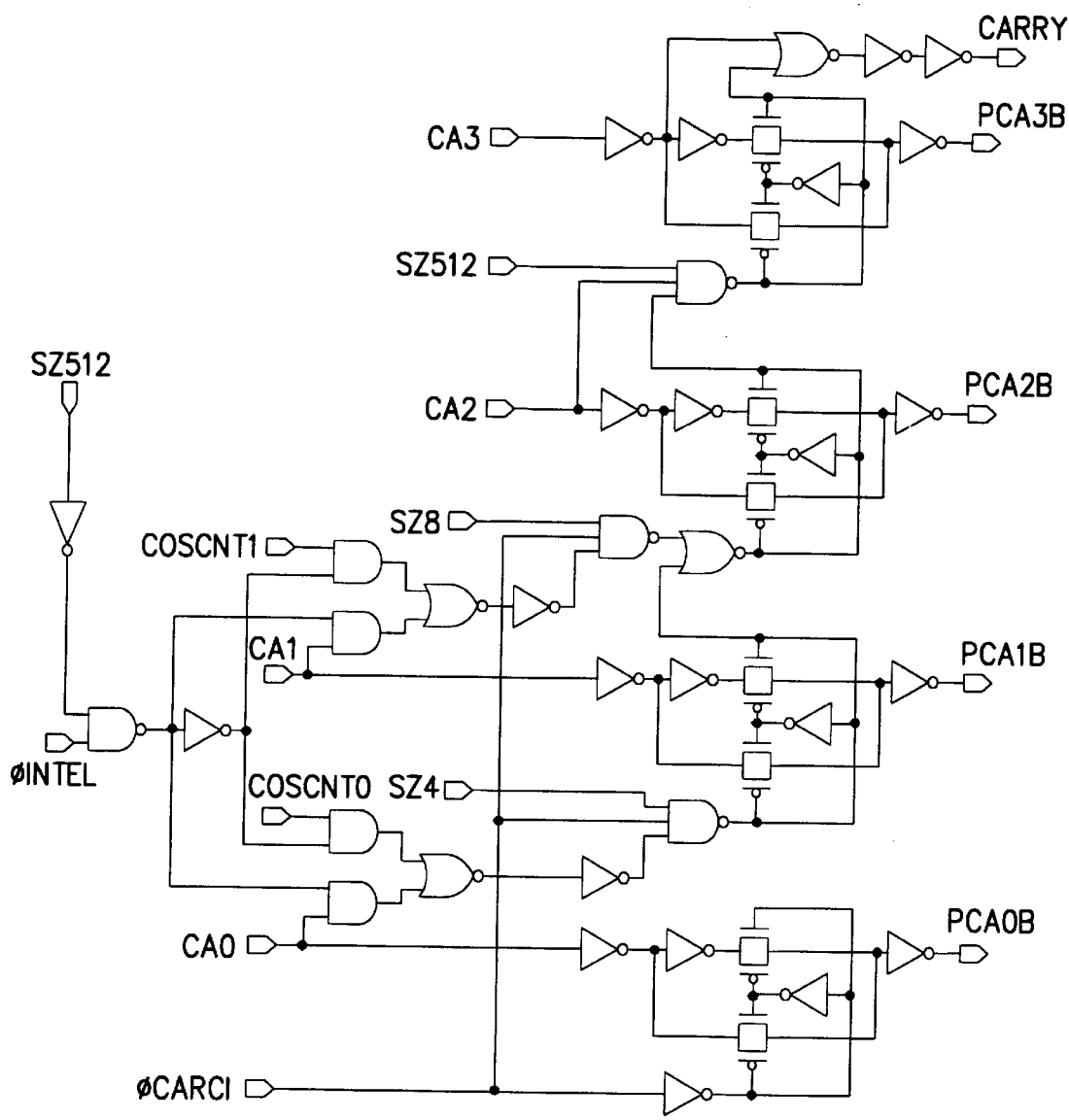
FIGS. 11A and 11B are detailed circuit diagrams of an asynchronous counter of FIG. 8 according to an embodiment of the present invention.
Figure 11B:
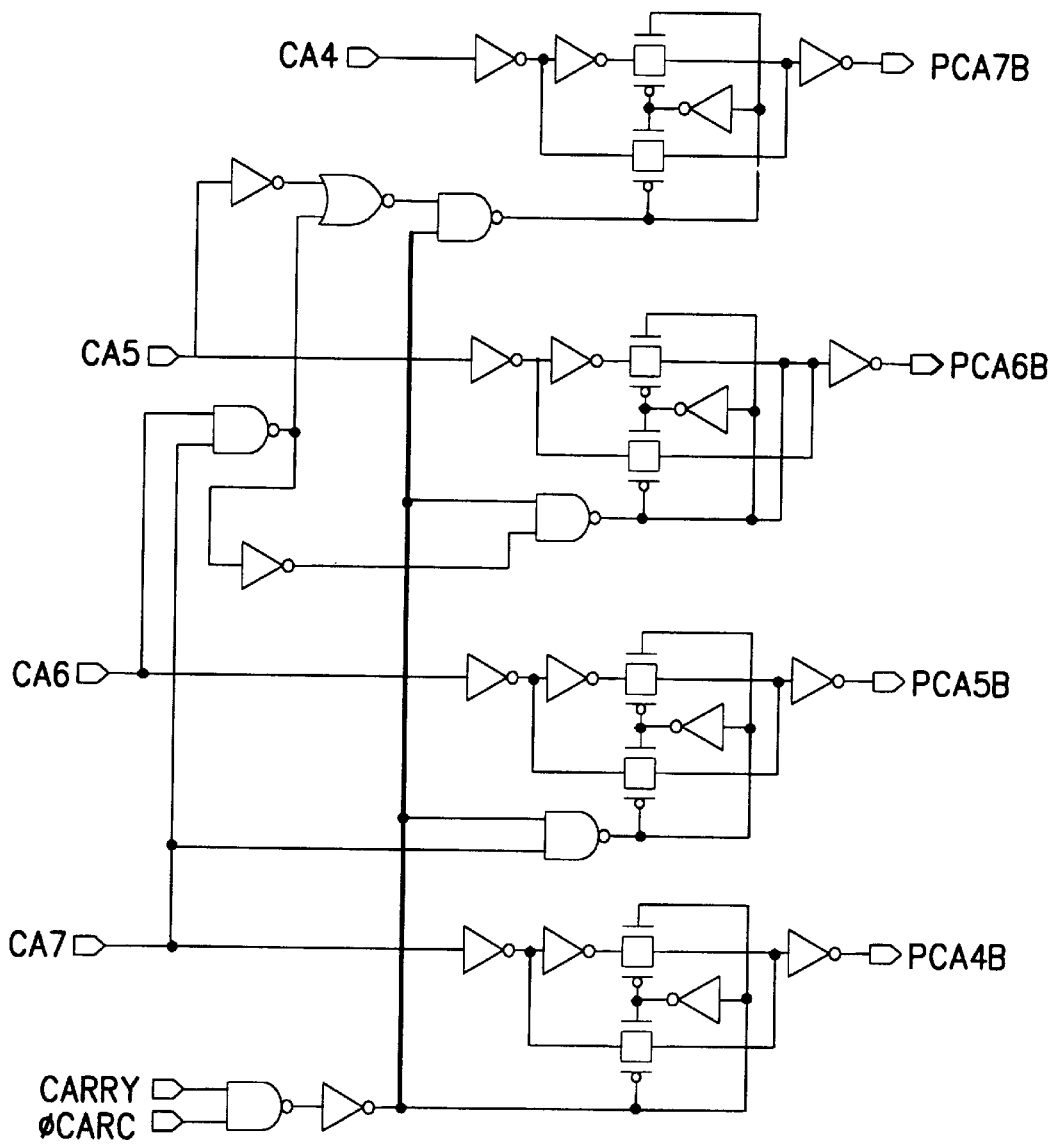

Referring to FIGS. 9 through 11, the column address buffer 100 and the asynchronous counter 102 exchanges, at every input of the clock φCLK, the bit output signal PCAi and a column address CAi. It should be further noted that the internal column address generation circuit according to the present invention is an asynchronous device, in which a synchronizing operation of the column address CAi with the clock φCLK is performed by the column address buffer 100, and the asynchronous counter 102 is, however, independent of the clock φCLK. Accordingly, compared with the prior art device in which the address counting is synchronized with the clock φCLK, the present invention has an advantage of speeding up the column address CAi. Namely, the present invention immediately generates the column address CAi in response to the system clock φCLK, so that generation of the column address CAi may be speeded up. Further, as shown in FIGS. 11A and 11B, the asynchronous counter 102 according to the present invention does not need a separate initializing operation, and generates the carry by using the column address signal CAi which does not include the invalid carry, thereby solving the problem of a generation of the invalid carry.

As shown in FIG. 10, the column address CAi is generated at the column address buffer 100 in synchronism with the system clock φCLK via a path of a signal input element 20 or another signal input element 22 according to the logic state of a signal φCA. When a read/write command is received, the signal φCA goes to the logic high state before the clock φCLK goes to the logic high state and, on the contrary, the signal φCA goes to the logic low state with a predetermined time delay if the clock φCLK becomes the logic low state. Therefore, if the signal φCA is at the logic high state, an output of a NAND gate 30 goes to the logic low state and thus, the external address Ai is outputted via the signal input element 20, a latch 38, and invertors 40, in which the signal input element 20 is comprised of transmission gates 24, 28 and a latch 26.

Alternatively, if the signal φCA is at the logic low state, a NAND gate 36 generates an output of the logic low state and thus, the bit output signal PCAi generated from the asynchronous counter 102 is outputted as an internal column address CAi via the signal input element 22, the latch 38, and the invertors 40. That is, upon receiving the first read/write command, the column address buffer 100 outputs the external address Ai as an internal column address CAi via the level converter 16, the delay 18 for controlling a setup/hold time, and the signal input element 20. Thereafter, in order to continuously generate the internal column address CAi for the burst mode operation, the column address buffer 100 outputs the internal column address CAi via the path of the signal input element 22 which receives the bit output signal PCAiB (in a sequential mode, corresponds to CAi+1 of the previous cycle) generated by asynchronously counting the internal column address CAi of the previous cycle.

Such internal column address CAi is waited (or stored) at a column address buffer to be generated as the internal column address at the next cycle, and this operation is performed by the asynchronous counter 102. The asynchronous counter 102 for converting the internal column address CAi into the bit output signal PCAiB is described in FIGS. 11A and 11B.

Referring to FIGS. 11A and 11B, the asynchronous counter 102 does not have an independent counting loop unlike the prior art synchronous counter 12, so that the inventive asynchronous counter is independent of the clock φCLK and calculates the internal column address CAi of the next cycle by simply utilizing the column address CAi, thereby to generate the bit output signal PCAiB.

Figure 1:
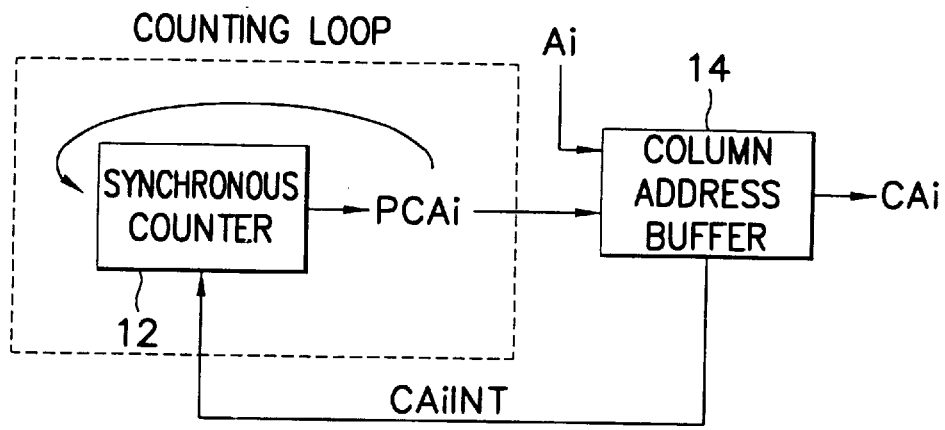
FIG. 1 is a block diagram of a circuit for generating an internal column address in a semiconductor memory device according to the prior art.
Figure 2:
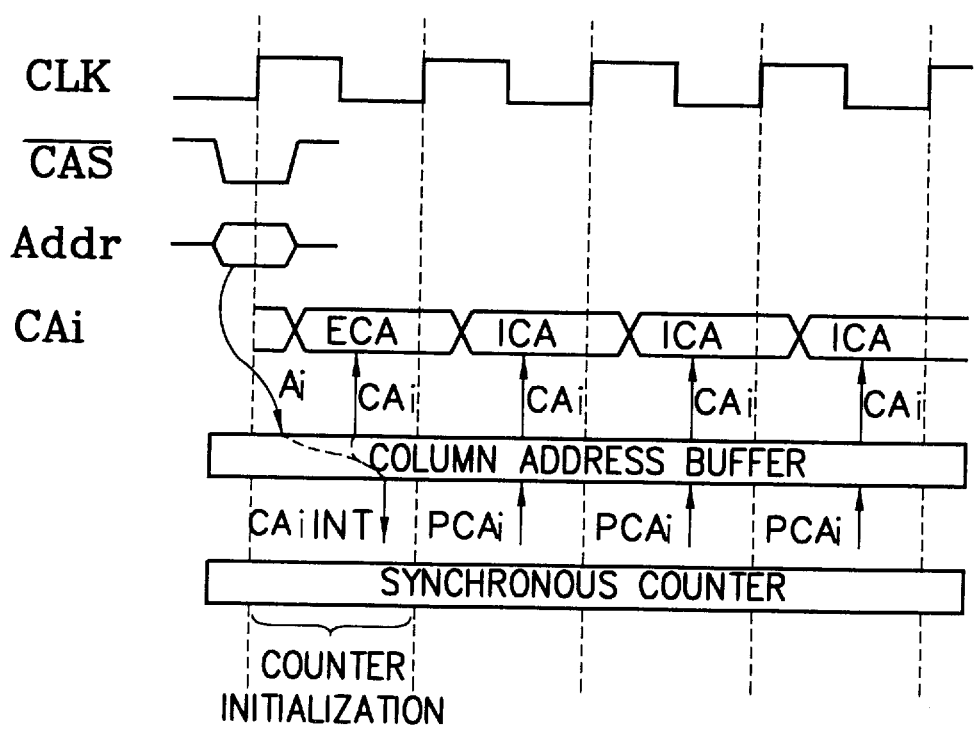
FIG. 2 is an operational timing diagram of the circuit for generating an internal column address shown in FIG. 1.
Figure 3:
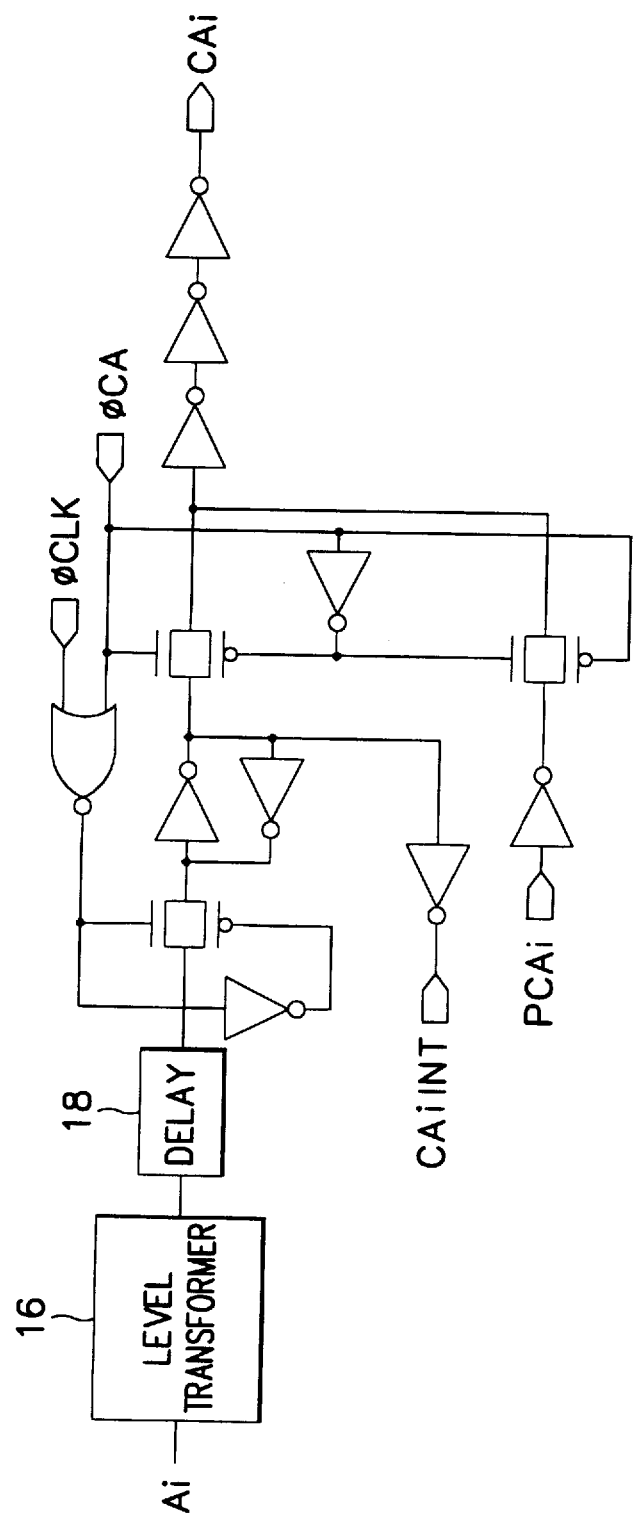
FIG. 3 is a detailed circuit diagram of a column address buffer shown in FIG. 1.
Figure 4:
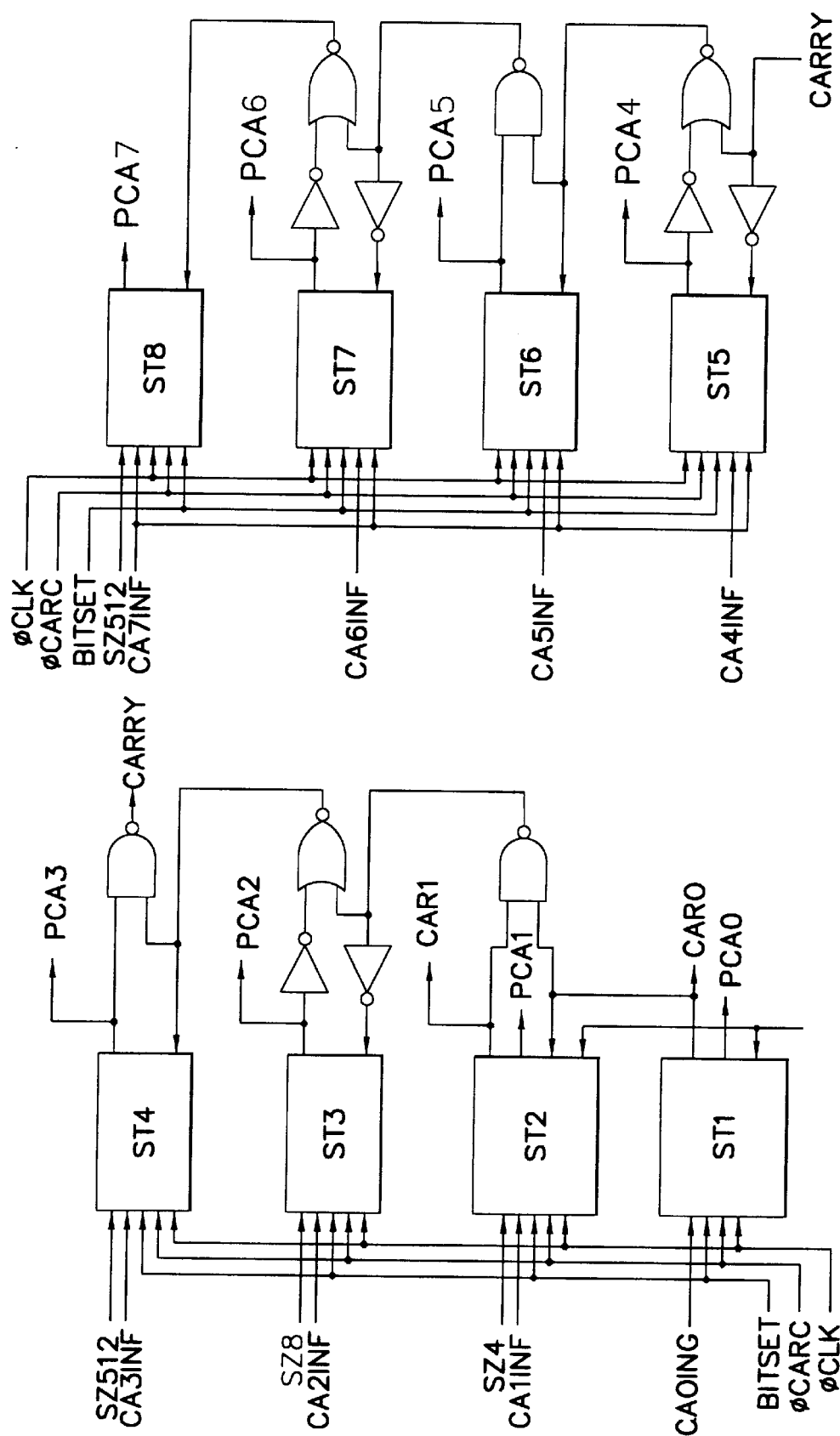
FIG. 4 is a block diagram of a synchronous counter shown in FIG. 1.
Figure 5:
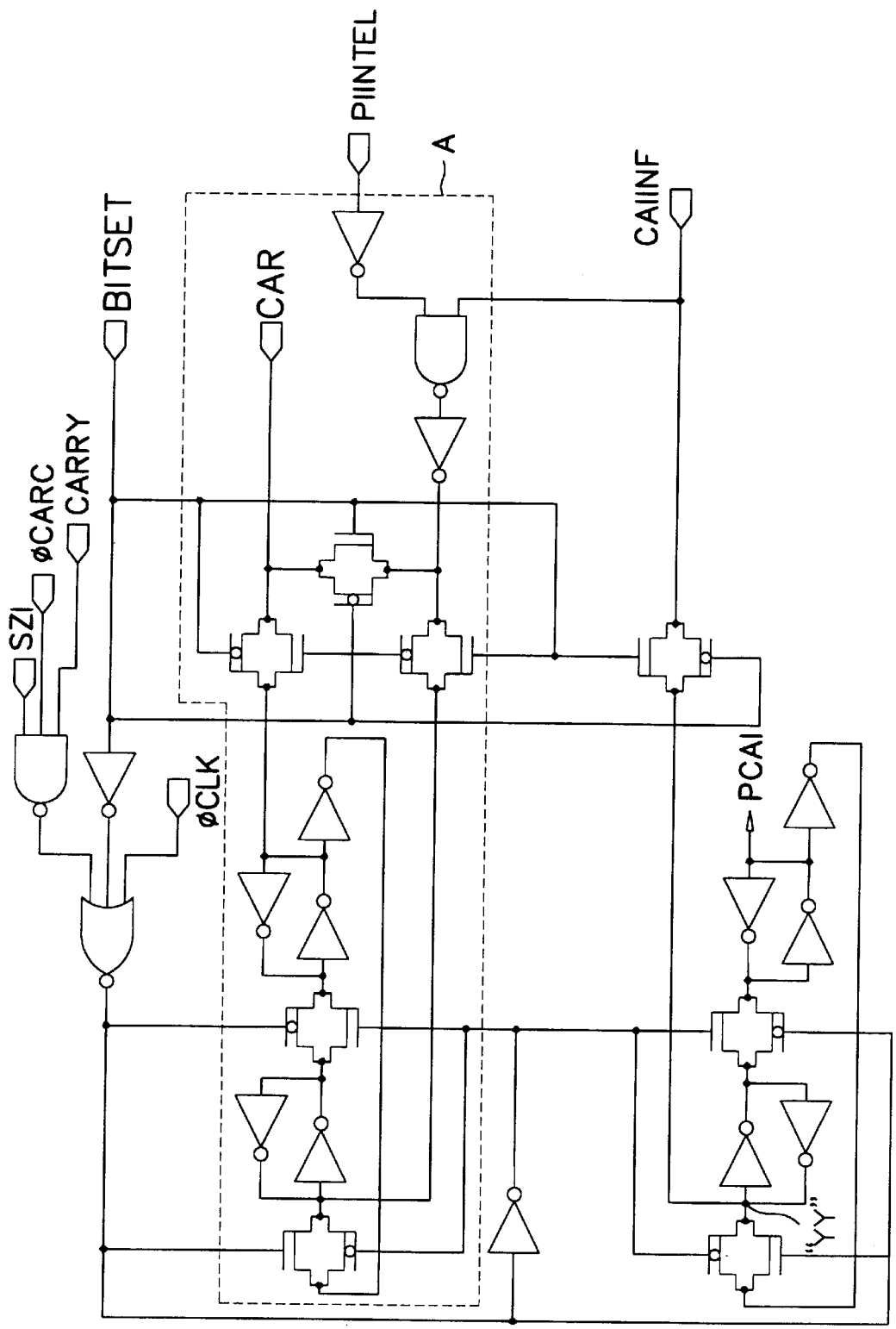
FIG. 5 is a diagram of an interleave mode counting circuit according to an embodiment of a unit counter in the synchronous counter shown in FIG. 4.
Figure 6:
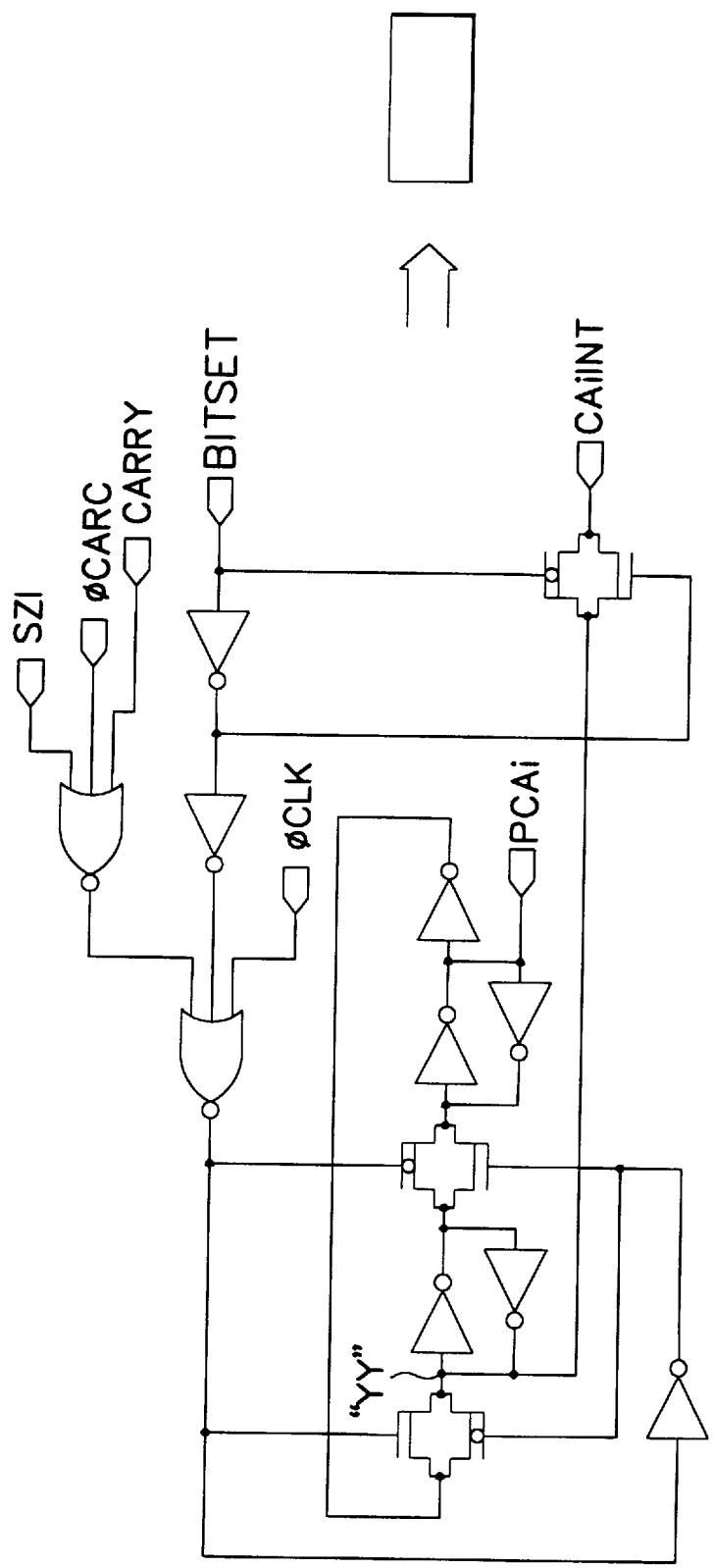
FIG. 6 is a diagram of a sequential mode counting circuit according to another embodiment of the unit counter in the synchronous counter shown in FIG. 4.
Figure 7:
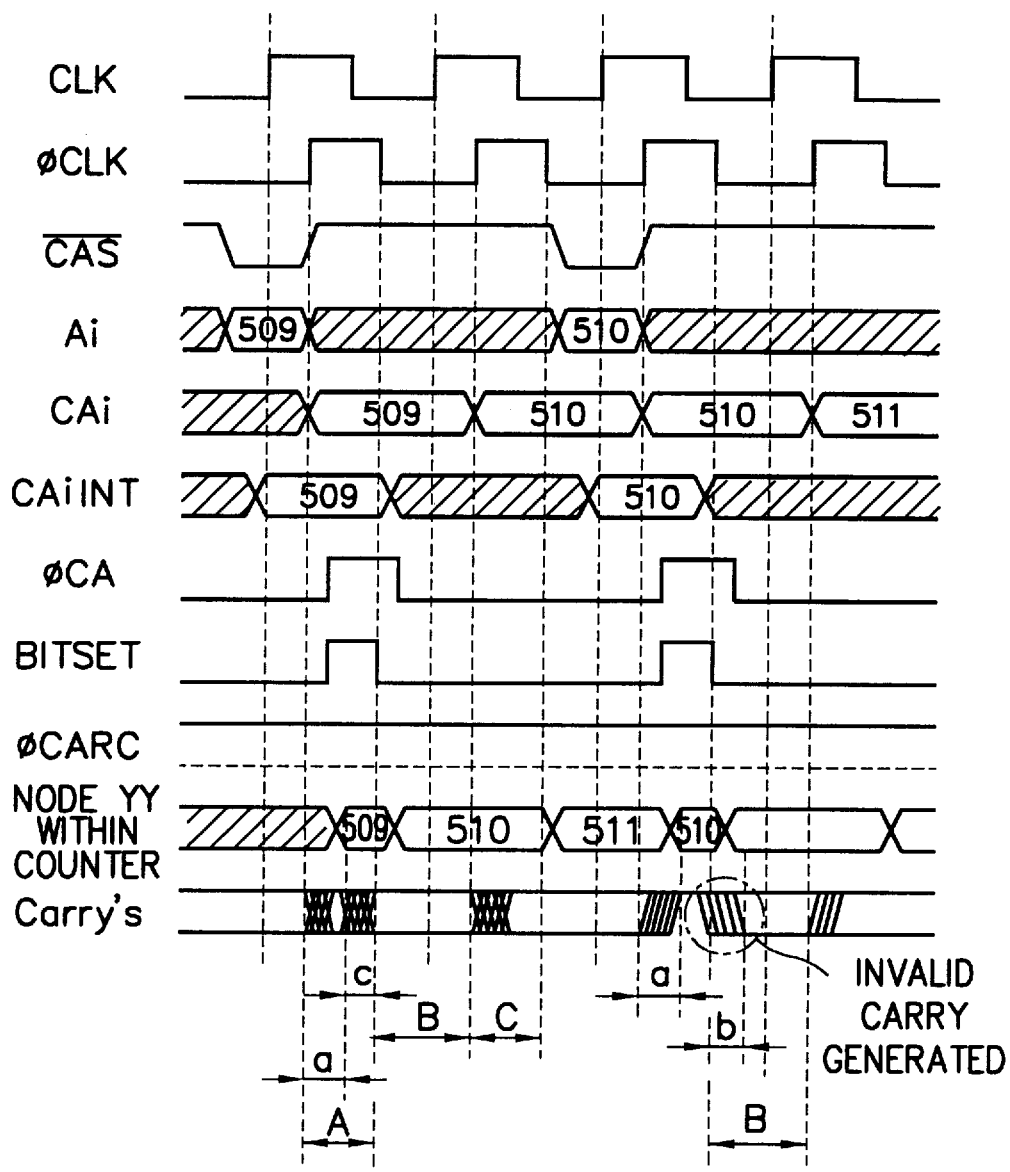
FIG. 7 is an operational timing diagram for explaining problems which may be caused when the internal column address generating circuit of FIG. 1 including a synchronous counter comprised of the unit counter of FIG. 5 or 6, generates the internal column address.

Moreover, since the internal column address CAi generated from the column address buffer 100 is used for calculating the carry, the initial setup of the counter such as in FIGS. 4 through 6 is not necessary. As shown in FIGS. 11A and 11B, the asynchronous counter 102 according to the present invention includes a path for generating the bit output signal PCAiB from the internal column address CAi and another path for generating the bit output signal PCAi from the internal column address CAiB. Such asynchronous counter 102 having two paths inverts the carry if the carry is at the logic high state, and does not invert the carry if the carry is at the logic low state. Thus, even though an erroneous bit output signal PCAiB is generated due to the invalid carry, the invalid carry is corrected to the valid carry as stated above, thereby recovering the erroneous bit output signal PCAiB to the valid bit output signal. This recovering operation is performed before the clock φCLK of the next cycle goes to the logic high state from the logic low state, thereby preventing a generation of the invalid internal column address CAi.

The asynchronous counter 102 is, as shown in FIGS. 11A and 11B, divided into two blocks in consideration of the positions of the address pins in the chip, and the operable blocks are changeable according to the burst length, which is the same as the existing asynchronous counter. For example, in case where the burst length is 8, burst length signals SZ8, SZ4 are all at the logic high state. At this moment, the asynchronous counter 102 receives the internal column address CA0, CA1, CA2 generated from the column address buffer 100 and thus, three stages for generating the bit output signals PCA0B, PCA1B, PCA2B are operated, exclusively. In this case, if a firstly received external address Ai is 5, the counting is performed in the sequence of 5, 6, 7, 0, 1, 2, 3, and 4. Namely, an address bit higher than the internal address bit CA2 does not make a transition.

Further, an address mode signal φINTEL becomes the logic high state when the asynchronous counter 102 operates in the interleave mode and has a meaning only when the burst length is SZi (where i=1, 2, 4, and 8). In this case, the carry for controlling the respective internal column address CAi is generated by a signal COSCNTi, instead of the internal column address CAi. Only two of the signals COSCNTi (i=0, 1), i.e., COSCNT0 and COSCNT1 are received. This is because the interleave mode counting is valid up to the burst length of 8, and in the interleave mode of operation, three unit counters corresponding to CA0, CA1, and CA2 are operated. (In practice, the interleave mode has a meaning when the burst length is 4 and 8. However, when the burst length is 1, the counting operation is not activated; and when the burst length is 2, it has the same result as the sequential mode.) Upon receiving the read/write command, the signal COSCNTi (i=0, 1), a burst length counting signal, is reset to (0,0) and increases in the sequence of (0,0) →(0,1) →(1,0) →(1,1). (After completion of the burst, the SDRAM automatically stops a data input/output operation.) In case of the full page counting, the burst length signals SZ512, SZ8, SZ4 are at the logic high state, and the interleave mode does not exist (is inactivated). Namely, the logic high sate of the address mode signal φINTEL is ignored by the logic high state of the burst length signal SZ512. A signal φCARC is a signal for determining an on/off of the overall counter and the counter is activated when the signal φCARC is at the logic high state.

As described heretofore, the internal column address generator according to the present invention has no separate initial setup path and generates the carry by utilizing the internal column address CAi with no invalid value, so that the problem of the generation of the invalid carry may be solved and the construction of the counter becomes simple, thereby reducing the overall layout space. Moreover, since the column address buffer performs the synchronizing operation of the address counting with the clock, the column address may be generated speedily. Further, the inventive device employs two paths of CAi→PCAiB and CAi→PCAi in order to prevent the maloperation due to the invalid carry and the paths are controlled by selecting the carry value.

Although a preferred embodiment of the present invention has been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A circuit for generating an internal column address in a synchronous semiconductor memory device, in which a memory cell is accessed in response to an external address, and an operation of accessing data from the memory cell is performed by continuously generating the internal address from the external address, comprising:

a column address buffer for synchronizing an initially received external address with an external system clock to generate the internal column address, and for synchronizing a counting bit output signal received at an internal input node with said external system clock to generate the internal column address; and asynchronous counting means connected to an output node of said column address buffer, for generating said bit output signal having the same or opposite phase as/to a phase of said internal column address received from said column address buffer, in response to a carry generation state.

2. The circuit for generating an internal column address according to claim 1, wherein said column address buffer comprises:

buffer means for converting a level of said external address and delaying the level-converted external address for a predetermined time for which a setup and hold time is controlled;

address selection means for selectively outputting any one of said external address from the buffer means and said bit output signal applied at the internal input node in synchronism with the external system clock, so as to output the internal column address; and latch means for latching the internal column address generated from said selection means.

3. The circuit for generating an internal column address according to claim 1 or 2, wherein said asynchronous counting means comprises:

means for generating a carry signal;

a plurality of blocks for receiving said internal column address;

first output means for detecting said carry signal and providing the internal input node in said column address buffer with the bit output signal having an opposite phase to a phase received in response to a first logic state of said carry signal; and second output means for detecting said carry signal and providing the internal input node in said column address buffer with the bit output signal having the same phase as a phase received in response to a second logic state of said carry signal.

4. The circuit for generating an internal column address according to claim 3, wherein said carry signal generating means generates the carry signal with the number of cycles counted after the burst progresses setting the cycle by a first address to zero, so as to generate the internal column address in an interleave mode.

* * * * *